US012810930B2

(12) United States Patent
Singh et al.

(10) Patent No.: US 12,810,930 B2
(45) Date of Patent: Nov. 24, 2026

(54) MULTI-BIT QUANTUM MEMORY CELL WITH INTEGRATED HIGH QUALITY FACTOR STORAGE RESONATORS

(71) Applicant: Dell Products L.P., Round Rock, TX (US)

(72) Inventors: Tejinder Singh, Manotick (CA); Navjot Kaur Khaira, Manotick (CA)

(73) Assignee: DELL PRODUCTS L.P., Round Rock, TX (US)

( * ) Notice: Subject to any disclaimer, the term of this patent is extended or adjusted under 35 U.S.C. 154(b) by 78 days.

(21) Appl. No.: 18/961,111

(22) Filed: Nov. 26, 2024

(65) Prior Publication Data

US 2026/0162717 A1 Jun. 11, 2026

(51) Int. Cl.
*G11C 11/44* (2006.01)
*G11C 7/10* (2006.01)
*G11C 11/19* (2006.01)

(52) U.S. Cl.
CPC ............ *G11C 11/44* (2013.01); *G11C 7/1069* (2013.01); *G11C 7/1096* (2013.01); *G11C 11/19* (2013.01)

(58) Field of Classification Search
None
See application file for complete search history.

(56) References Cited

U.S. PATENT DOCUMENTS

2021/0328127 A1 10/2021 Kwon et al.
2025/0200412 A1 6/2025 Sandberg et al.

OTHER PUBLICATIONS

Asfaw, A. Sigillito, A. Tyryshkin, T. Schenkel, and S. A. Lyon, "Multi-frequency spin manipulation using rapidly tunable superconducting coplanar waveguide microresonators," Appl. Phys. Lett., vol. 111, No. 3, 2017. 6 pages.

J. Healey, T. Lindstrom, M. Colclough, C. Muirhead, and A. Y. Tzalenchuk, "Magnetic field tuning of coplanar waveguide resonators," Appl. Phys. Lett., vol. 93, No. 4, 2008. 15 pages.

J. Annunziata, D. F. Santavicca, L. Frunzio, G. Catelani, M. J. Rooks, A. Frydman, and D. E. Prober, "Tunable superconducting nanoinductors," Nanotechn., vol. 21, No. 44, 2010. 6 pages.

(Continued)

*Primary Examiner* — Alfredo Bermudez Lozada

(74) *Attorney, Agent, or Firm* — Amin, Turocy & Watson, LLP

(57) ABSTRACT

The technology described herein is directed towards a quantum memory device comprising an array of independently addressable quantum memory cells for writing, storing and reading quantum bits (qubits) of information, based on variable coupling between tunable interface resonators and quantum storage cavities. Tuning the resonators of one quantum memory cell to the same frequency facilitates the energy exchange of qubit information, thereby transferring quantum information to or from the quantum storage cavity for a write operation or a read operation, respectively; detuning stores the quantum information in the quantum storage cavity by preventing transfer. One implementation uses rf-SQUIDs for tuning the tunable interface resonator. This facilitates fast frequency adjustments to tune and detune the tunable resonator, enabling the quantum state read/write operations. Different length resonator inductors for the quantum storage cavities in an array result in different resonance frequencies. The quantum storage cavities also can have tunable resonators.

20 Claims, 17 Drawing Sheets

(56) References Cited

OTHER PUBLICATIONS

M. R. Vissers, J. Hubmayr, M. Sandberg, S. Chaudhuri, C. Bockstiegel, and J. Gao, "Frequency-tunable superconducting resonators via nonlinear kinetic inductance," Appl. Phys. Lett., vol. 107, No. 6, 2015. 10 pages.

O. Kennedy, J. Burnett, J. Fenton, N. Constantino, P.Warburton, J. Morton, and E. Dupont-Ferrier, "Tunable Nb superconducting resonator based on a constriction nano-SQUID fabricated with a Ne focused ion beam," Physical Rev. Appl., vol. 11, No. 1, 2019. 9 pages.

Khaira, et al. "Superconducting Tunable Resonator With Wide Tuning Range Utilizing Radio Frequency Superconducting Quantum Interference Devices and Multi-Stacked Capacitor" U.S. Appl. No. 18/961,071, filed Nov. 26, 2024, 34 pages.

Singh, et al. "Sense-Tap Device for Qubit Coherence Verification and Error Detection in Quantum Memories" U.S. Appl. No. 18/961,091, filed Nov. 26, 2024, 39 pages.

Singh, et al. "Quantum Memory Cell Using Broadband Superconducting Tunable Resonator" U.S. Appl. No. 18/961,119, filed Nov. 26, 2024, 40 pages.

Singh, et al. "Monolithic Integrated Quantum Memory Device Array With Multi-Layer Superconducting Stack" U.S. Appl. No. 18/961,141, filed Nov. 26, 2024, 45 pages.

Non Final Office Action received for U.S. Appl. No. 18/961,091 dated May 12, 2026, 16 pages.

Notice of Allowance received for U.S. Appl. No. 18/961,091 dated Jul. 10, 2026, 09 pages.

Notice of Allowance received for U.S. Appl. No. 18/961,141 dated May 7, 2026, 11 pages.

to FIG. 2

Side Stack of the 64-bit Quantum Memory

MULTI-BIT QUANTUM MEMORY CELL WITH INTEGRATED HIGH QUALITY FACTOR STORAGE RESONATORS

RELATED APPLICATIONS

The subject patent application is related to U.S. patent application Ser. No. 18/961,071, filed Nov. 26, 2024, and entitled "SUPERCONDUCTING TUNABLE RESONATOR WITH WIDE TUNING RANGE UTILIZING RADIO FREQUENCY SUPERCONDUCTING QUANTUM INTERFERENCE DEVICES AND MULTI-STACKED CAPACITOR", U.S. patent application Ser. No. 18/961,119, filed Nov. 26, 2024, and entitled "QUANTUM MEMORY CELL USING BROADBAND SUPERCONDUCTING TUNABLE RESONATOR", U.S. patent application Ser. No. 18/961,091, filed Nov. 26, 2024, and entitled "SENSE-TAP DEVICE FOR QUBIT COHERENCE VERIFICATION AND ERROR DETECTION IN QUANTUM MEMORIES", U.S. patent application Ser. No. 18/961,141, filed Nov. 26, 2024, and entitled "MONOLITHIC INTEGRATED QUANTUM MEMORY DEVICE ARRAY WITH MULTI-LAYER SUPERCONDUCTING STACK", the respective entireties of which patent applications are hereby incorporated by reference herein.

BACKGROUND

In the field of quantum computing, quantum memory devices store quantum information, including the state of quantum bits (qubits), while preserving the coherence of the quantum states. As such, efficient and reliable quantum memory devices are needed in quantum technologies.

However, combining multiple quantum memory cells into a quantum memory device has a number of considerations, including the need for independent addressing and parallel addressing to facilitate efficient read and write operations. Further, the quantum state stored in one memory cell needs to be isolated from each other memory cell.

BRIEF DESCRIPTION OF THE DRAWINGS

The technology described herein is illustrated by way of example and not limited to the accompanying figures in which like reference numerals indicate similar elements and in which.

DETAILED DESCRIPTION

Figure 1:
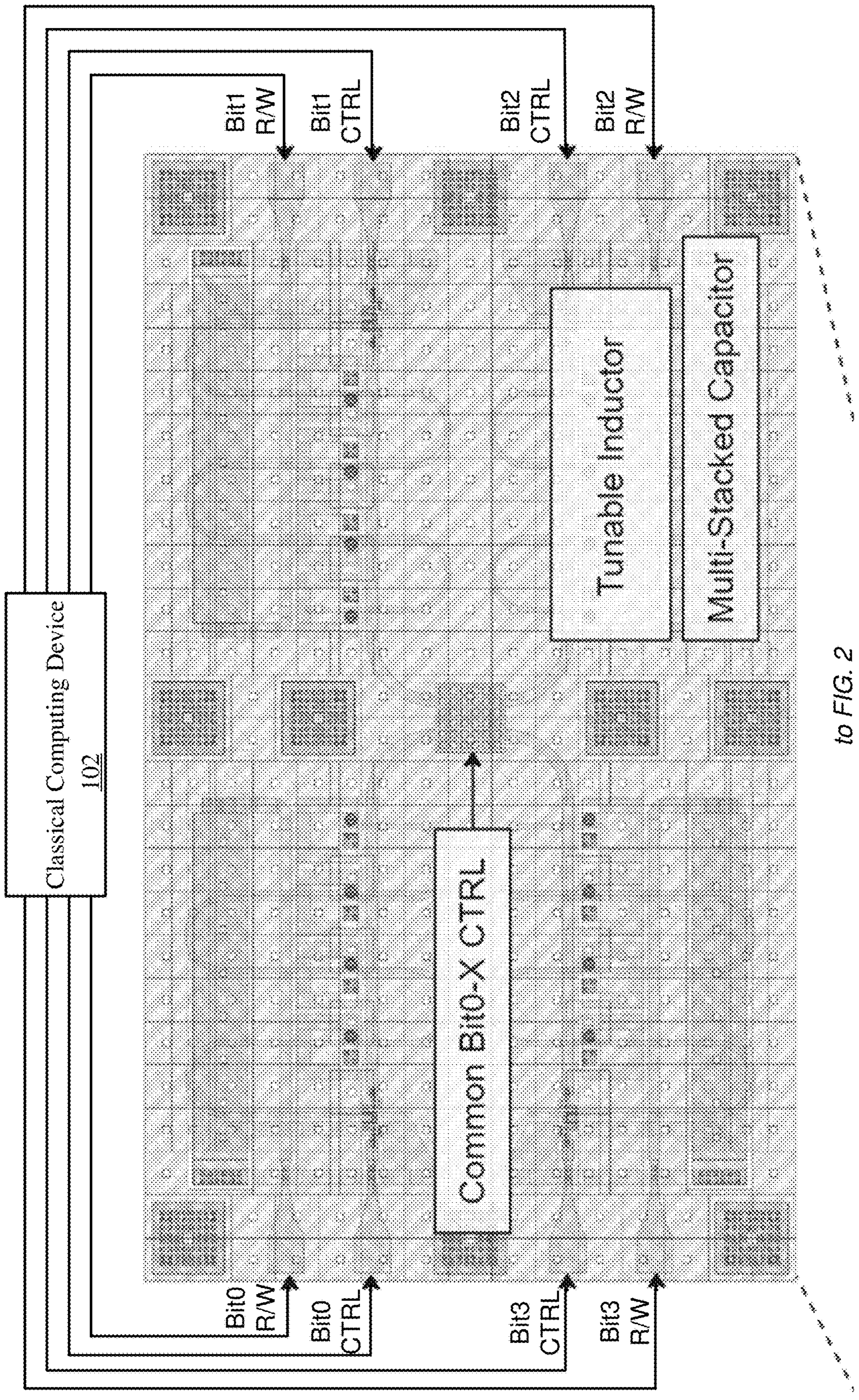
FIG. 1 is a top-view representation of an example quantum four-bit quantum memory storage device with independent control and read/write of each quantum memory cell, in accordance with various example embodiments and implementations of the subject disclosure.

The technology described herein is generally directed towards a scalable, current-tunable quantum memory device comprising an array of (e.g., four) quantum memory cells, each capable of storing a single quantum bit. As will be understood, the technology described herein facilitates independent classical control and parallel addressing of each quantum memory cell within the array, which enables parallel operations, significantly increasing the bandwidth for read/write operations. The design supports a modular approach, allowing for scalable memory devices, e.g., quantum memory devices from 4-bit to one kilobyte (1 kb) in size, which can be further scaled, are shown as examples herein.

In one implementation, a multi-layered architecture, utilizing superconducting thin-film layers, ensures robust isolation between quantum memory cells, significantly minimizing cross-talk and maintaining data integrity. The integration of electromagnetic shielding poles further enhances the isolation between quantum memory cells, by protecting the system from external electromagnetic interference, ensuring long coherence times and reliable quantum information storage.

In general, the quantum storage cells described herein are based on matching the resonance frequency of a tunable resonator to that of a quantum storage cavity resonator, which transfers the energy of a quantum bit to the quantum storage cavity, facilitating a write operation. The resonance frequencies are detuned, thereby storing the quantum bit in the quantum storage cavity, until later retuned to transfer the quantum bit back, facilitating a read operation. In one implementation, so that each quantum memory cell is independently written to/read from, each of the quantum memory cells in an array have a quantum storage cavity (resonator) with a different resonance frequency based on having a different length resonator, e.g., based on various length trimming. In another implementation, at least some of the quantum storage cavities themselves can be tunable.

Reference throughout this specification to "one embodiment," "an embodiment," "one implementation," "an implementation," etc. means that a particular feature, structure, characteristic and/or attribute described in connection with the embodiment/implementation can be included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, characteristics and/or attributes may be combined in any suitable manner in one or more embodiments/implementations. Repetitive description of like elements employed in respective embodiments may be omitted for sake of brevity.

The detailed description is merely illustrative and is not intended to limit embodiments and/or application or uses of embodiments. Furthermore, there is no intention to be bound by any expressed or implied information presented in the preceding sections, or in the Detailed Description section. Further, it is to be understood that the present disclosure will be described in terms of a given illustrative architecture; however, other architectures, structures, materials and process features, and steps can be varied within the scope of the present disclosure.

It also should be noted that terms used herein, such as "optimize," "optimization," "optimal," "optimally" and the like only represent objectives to move towards a more optimal state, rather than necessarily obtaining ideal results. Similarly, "maximize" means moving towards a maximal state (e.g., up to some processing capacity limit), not necessarily achieving such a state, and so on.

It will also be understood that when an element such as a layer, region or substrate is referred to as being "on" or "over" "atop" "above" "beneath" "below" and so forth with respect to another element, it can be directly on the other element or intervening elements can also be present. In contrast, only if and when an element is referred to as being "directly on" or "directly over" another element, are there no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

The following detailed description is merely illustrative and is not intended to limit embodiments and/or application or uses of embodiments. Furthermore, there is no intention to be bound by any expressed or implied information presented in the preceding sections, or in the Detailed Description section.

One or more example embodiments are now described with reference to the drawings, in which example components, graphs and/or operations are shown, and in which like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details, and that the subject disclosure may be embodied in many different forms and should not be construed as limited to the examples set forth herein.

Figure 2:
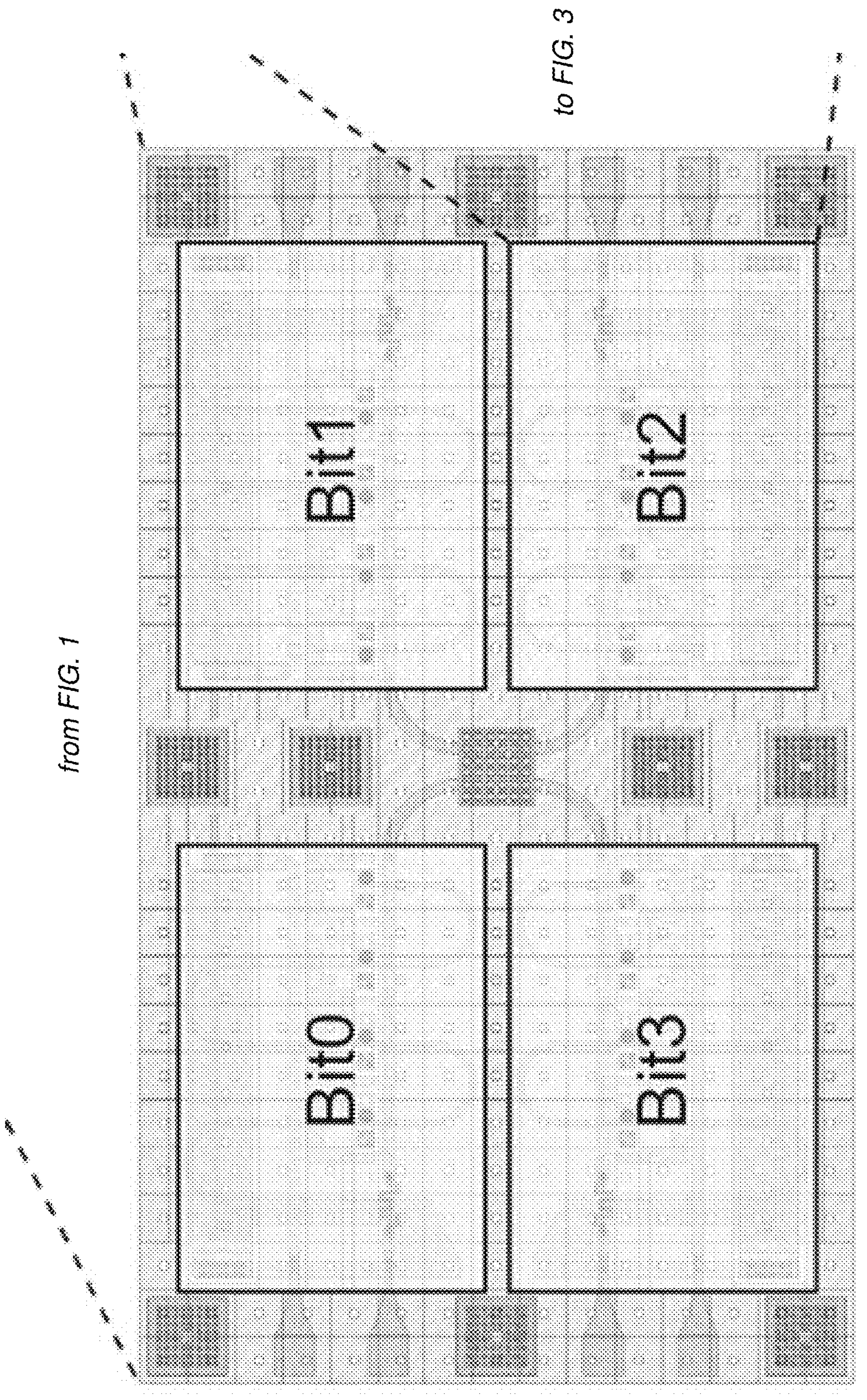
FIG. 2 is a representation of the layout of FIG. 1, in accordance with various example embodiments and implementations of the subject disclosure.

FIGS. 1 and 2 show one example design and layout of a of a scalable, current-tunable quantum memory device 100 having four quantum memory cells, each quantum memory cell capable of storing a single quantum bit. In FIG. 1, each quantum memory cell is independently addressable (Bit0, Bit1, Bit2, and Bit3), e.g., by a classical computing device 102. The control and read/write lines for each quantum memory cell are identified, allowing for individual manipulation and access.

In general, each quantum memory cell, such as the quantum memory cell corresponding to Bit0, includes a tunable resonator and a quantum storage cavity (e.g., a fixed resonator). A write operation occurs when the classical computing device outputs a control signal (e.g., a DC current) to resonate the tunable resonator at the same frequency as the quantum storage cavity's resonator, which transfers a qubit (its energy) from a superconducting wire coupled to the tunable resonator to the quantum storage cavity; after the transfer, the resonators are detuned by a subsequent control signal (a different DC current), whereby the qubit is stored in the quantum storage cavity. A read operation occurs when the classical computing device outputs another control signal to again resonate the tunable resonator at the same frequency as the quantum storage cavity's resonator, which transfers the qubit back from the quantum storage cavity to the superconducting wire.

Figure 3:
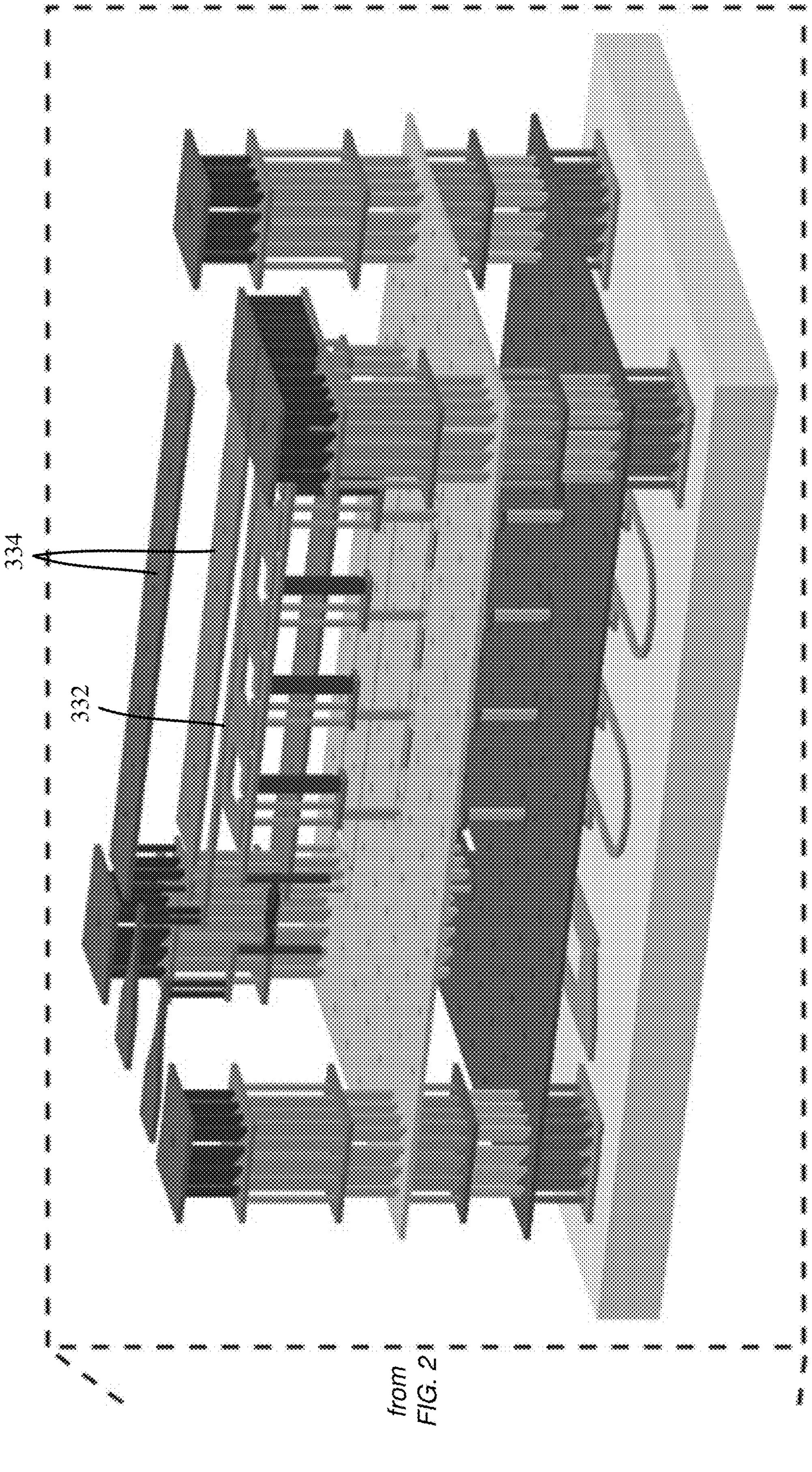
FIG. 3 is a is a three-dimensional (3D) perspective view of the multi-layered structure of one bit storage cell of the quantum memory storage device of FIG. 1, highlighting a tunable inductor and multi-stacked capacitor, in accordance with various example embodiments and implementations of the subject disclosure.

The image of FIG. 3 provides a 3D view of an example single 1-bit storage cell, highlighting the multi-layered structure, including a tunable inductor 332 and multi-stacked capacitor 334 of the tunable resonator. The multi-layer architecture, featuring superconducting thin-film layers, ensures robust isolation and minimal cross-talk between the quantum memory cells, which is essential for preserving the coherence of stored quantum states. Additional details of the tunable resonator and the quantum storage cavity are described with reference to FIGS. 4-6.

Figure 4:
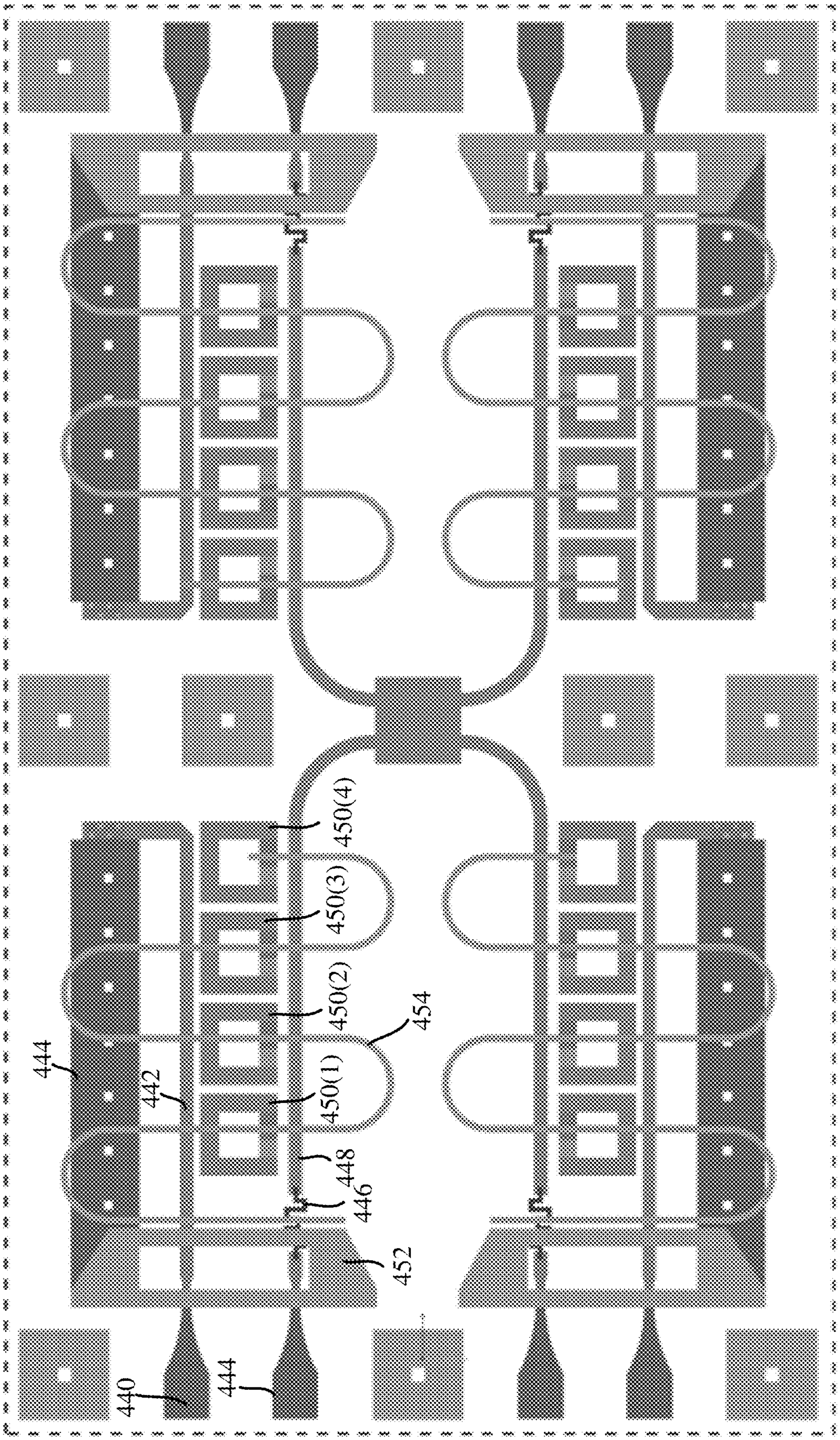
FIG. 4 is a two-dimensional (2D) representation of an example quantum four-bit quantum memory storage device, in which the components are shown overlayed one another and certain layers are omitted to highlight internal components, in accordance with various example embodiments and implementations of the subject disclosure.

More particularly, as shown in FIG. 4, four quantum storage cavities are coupled to a transmission feed-line via frequency-tunable resonators. For purposes of clarity, only one of the quantum memory cells, e.g., for Bit0, has its components labeled; the other quantum memory cells are virtually identical and symmetrically arranged.

Thus, a quantum bit is input at contact 440 to a transmission feed-line coupled to the tunable inductor 442, which is in series with this cell's capacitor 444. A control signal (DC) through a resistive element 446 tune the tunable inductor 442. More particularly, by applying a DC current to the control line 448, the magnetic flux within the radio frequency-superconducting quantum interference devices (rf-SQUIDs) 450(1)-450(4) is altered, which adjusts the inductance of the tunable resonator's inductor 442, thereby modifying its resonance frequency. This design enables precise control over the coupling between the transmission feed-line and the storage cavities, facilitating efficient read/write operations.

The quantum storage cavity for the quantum memory cell for Bit0 includes a coupling capacitor 452 that couples the tunable resonator to the quantum storage cavity. The quantum storage cavity also includes a fixed inductor 454, which in this example is a meandering (serpentine) superconducting microstrip line, thereby resonating at a fixed frequency. When the tunable resonator is controlled to resonate at the same frequency, the transfer of the qubit from the tunable resonator to the quantum storage cavity occurs; after this, the tunable resonance is changed, preventing transfer back, and thereby storing the qubit energy in the quantum storage cavity (capacitor 452 and inductor 454), until read back by again tuning the tunable resonance to match the resonance frequency of the quantum storage cavity.

Figure 5:
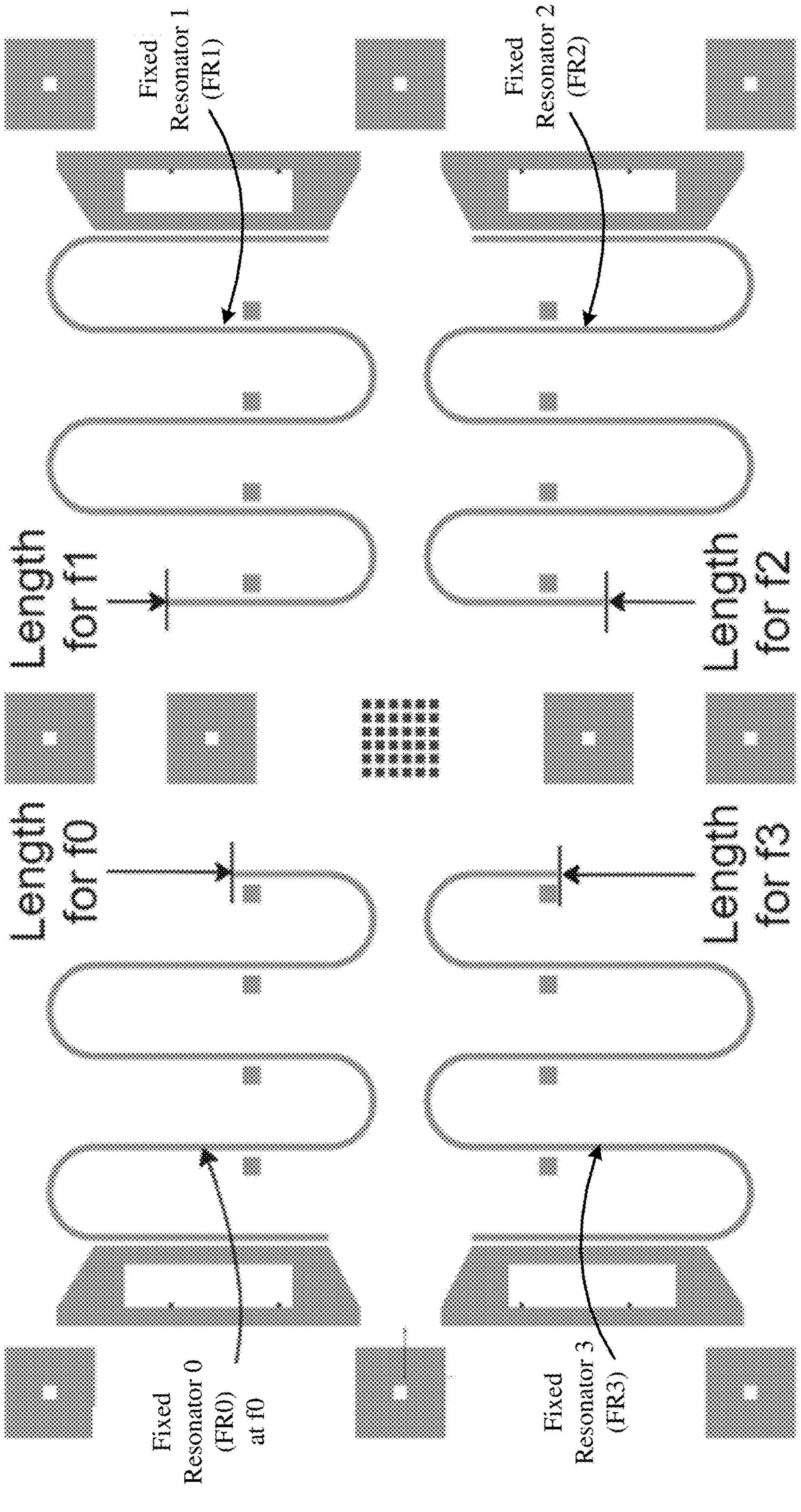
FIG. 5 is a bottom view representation of the example quantum four-bit quantum memory storage device of FIG. 4, in accordance with various example embodiments and implementations of the subject disclosure.

FIG. 5 shows an implementation in which the storage cavities are fixed frequency designs (FR0, FR1, FR2, FR3). There are resonant frequency differences, e.g., a few MHz differences between their resonance frequencies for isolation and to prevent any crosstalk between the storage cavities, as they are in close proximity to each other. In one implementation, this is accomplished by having different length fixed resonators, as depicted in FIG. 5. Note that an eight memory unit cell (and larger) can be accomplished by having eight different lengths, and so on, although at some level the amount of frequency separation needed for isolation/crosstalk prevention between the cells of a single array will limit the practical number of different fixed resonator lengths. This can be assisted to some extent by staggering the different lengths so that closer frequencies are physically farther apart from one another.

Figure 6:
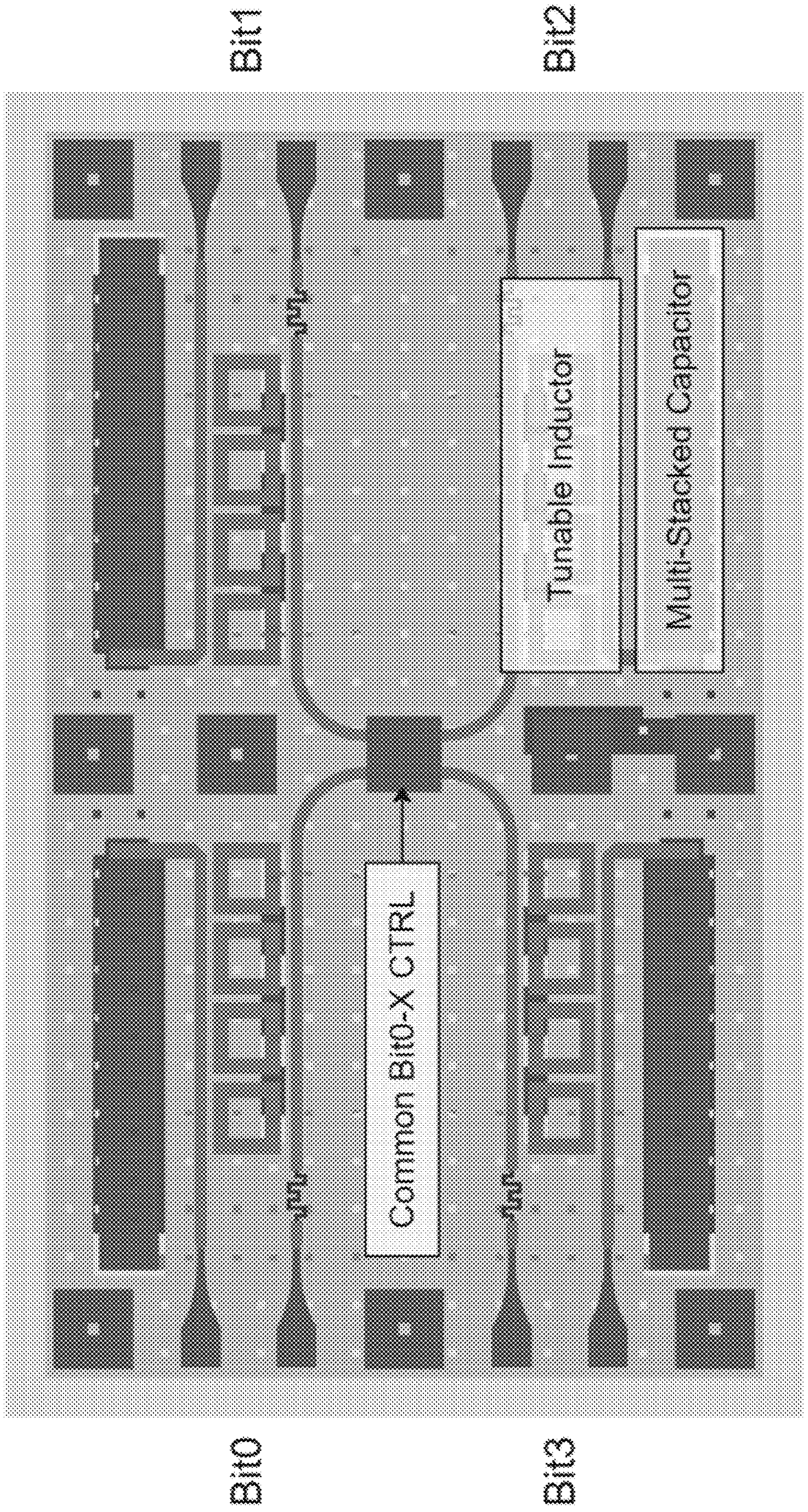
FIG. 6 is a top view representation of the example quantum four-bit quantum memory storage device of FIG. 4, to highlight that each cell in the storage device is individually addressable and controllable, in accordance with various example embodiments and implementations of the subject disclosure.

As reiterated in FIG. 6, the tunable resonators perform the system's read and write functionality based on the control signal (DC current) applied to the control lines. Because of the different resonant frequencies of the fixed resonators, each memory cell in the device is individually addressable and controllable.

Figure 7:
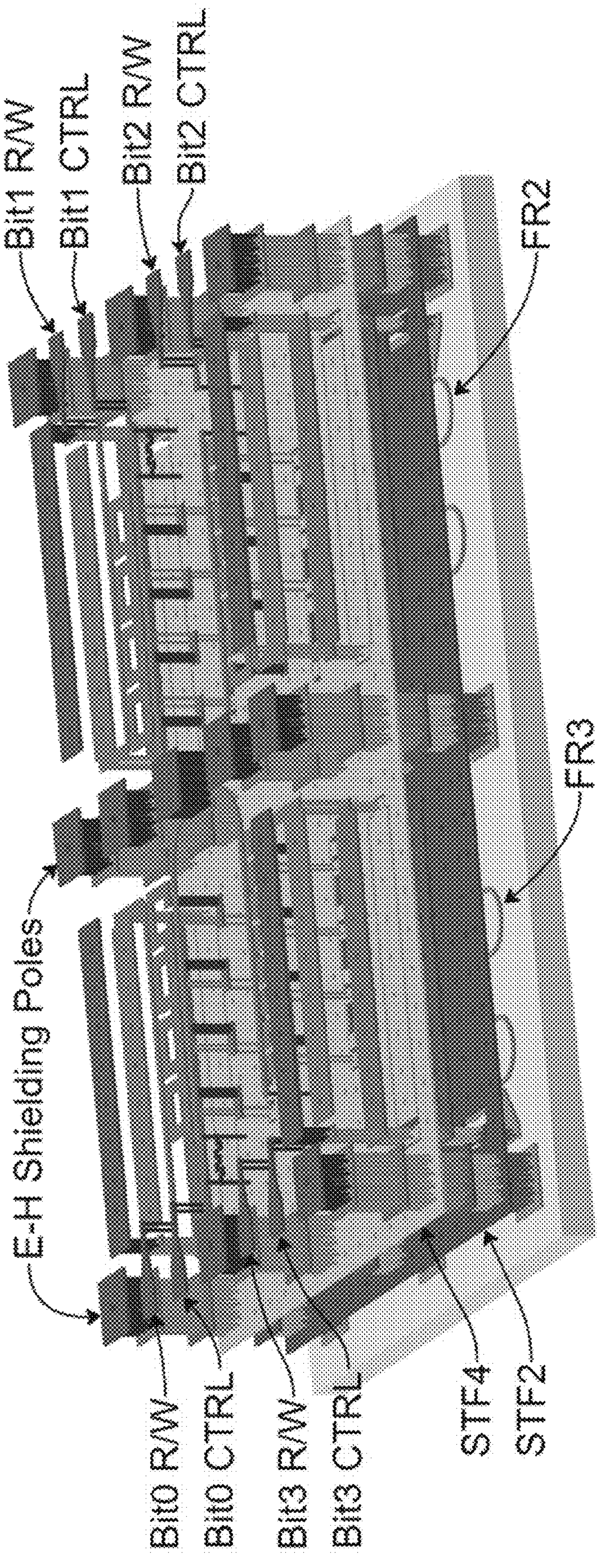
FIG. 7 is a 3D view representation of an example layout/structure of the quantum four-bit quantum memory storage device, spread across multiple superconducting thin film layers, in accordance with various example embodiments and implementations of the subject disclosure.

The multi-bit read/write operation and the control lines of the 4-bit quantum memory device become readily apparent in the 3D layout shown in FIG. 7. The 3D view of the layout reveals a structure that is spread across multiple superconducting thin film layers. The device is further surrounded by E-H shielding poles to prevent any external interference.

Figure 8:
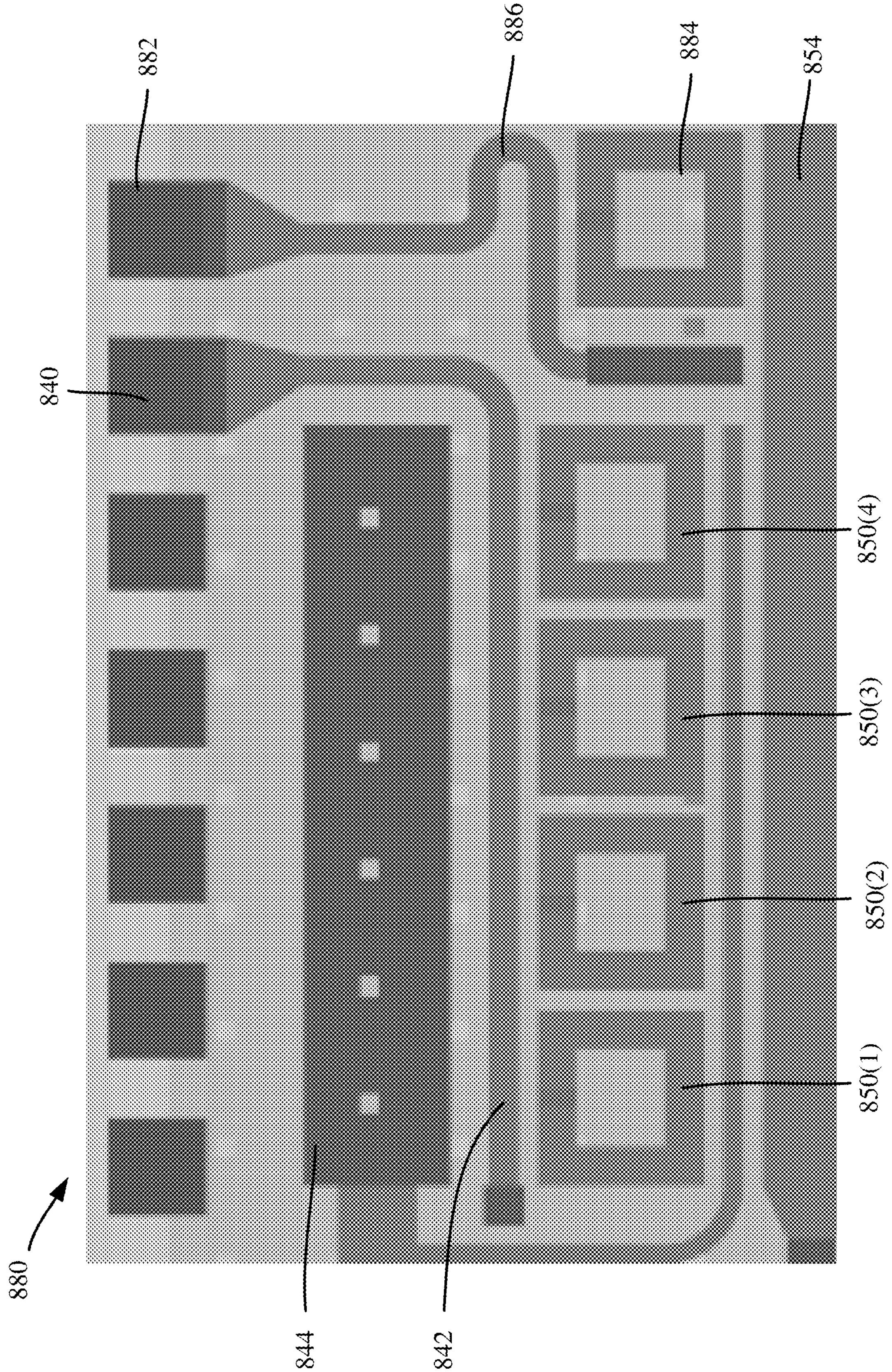
FIG. 8 is a top-view representation of an example quantum memory cell in which both the tunable interface resonator and the quantum storage cavity have tunable resonances, in accordance with various example embodiments and implementations of the subject disclosure.

FIG. 8 shows an alternative implementation in which the resonators of the quantum storage cavities are also tunable, which can be separate, or combined with different fixed length resonators. Note that FIG. 8 shows only one quantum memory cell 880, however, it is understood that such a quantum memory cell can be arranged with others in a quantum memory storage device with multiple memory cells.

In the example of FIG. 8, the tunable inductor 842 and the capacitor 844 of the tunable resonator operate generally as before, with a control signal applied (e.g., at contract 840) to change the magnetic flux of the rf-SQUIDS 850(1)-850(4) inductively coupled to the tunable inductor 842, and thereby change the resonance frequency of the tunable resonator. The quantum storage cavity also has a fixed length resonator 854 (the coupling capacitor is not visible in this view), which in this implementation is inductively coupled to (at least one) RF SQUID 884. A controlled resonator current applied at the contact 882, connected to a wire 886 inductively coupled to the RF SQUID 884, the similarly changes the magnetic flux of the RF SQUID 884 and thereby varies the inductance of the fixed length resonator inductor 854 and corresponding resonance frequency of the quantum storage cavity.

For example, any fixed-length resonator can be fine-tuned with respect to its resonance frequency using the circuit of FIG. 8, with one additional control wire, to thereby better match the resonance frequency of the tunable inductor portion of the cell. Further, tuning and detuning can be more coarse, whereby the need for different fixed lengths of different quantum storage cavity resonators can be eliminated, or at least mitigated, by tuning each quantum storage cavity resonator to a different resonance frequency that can be selectively matched by the above-described tunable interface resonator of the quantum memory cell for read and write operations.

Figure 9:
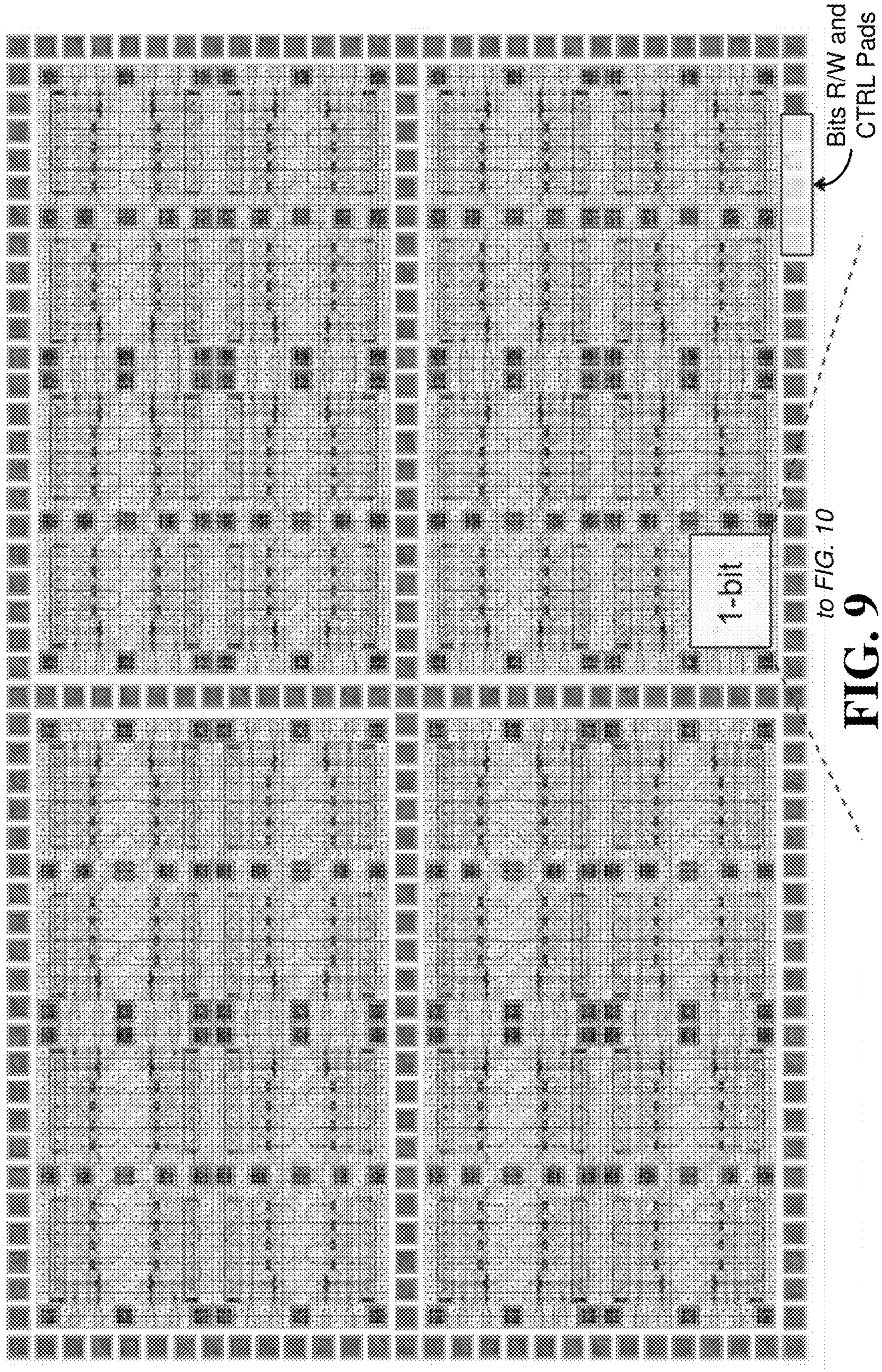
FIG. 9 is a representation of an example layout of a 64-bit quantum memory device (in which the components are overlayed and certain layers are omitted to highlight internal components), in accordance with various example embodiments and implementations of the subject disclosure.
Figure 10:
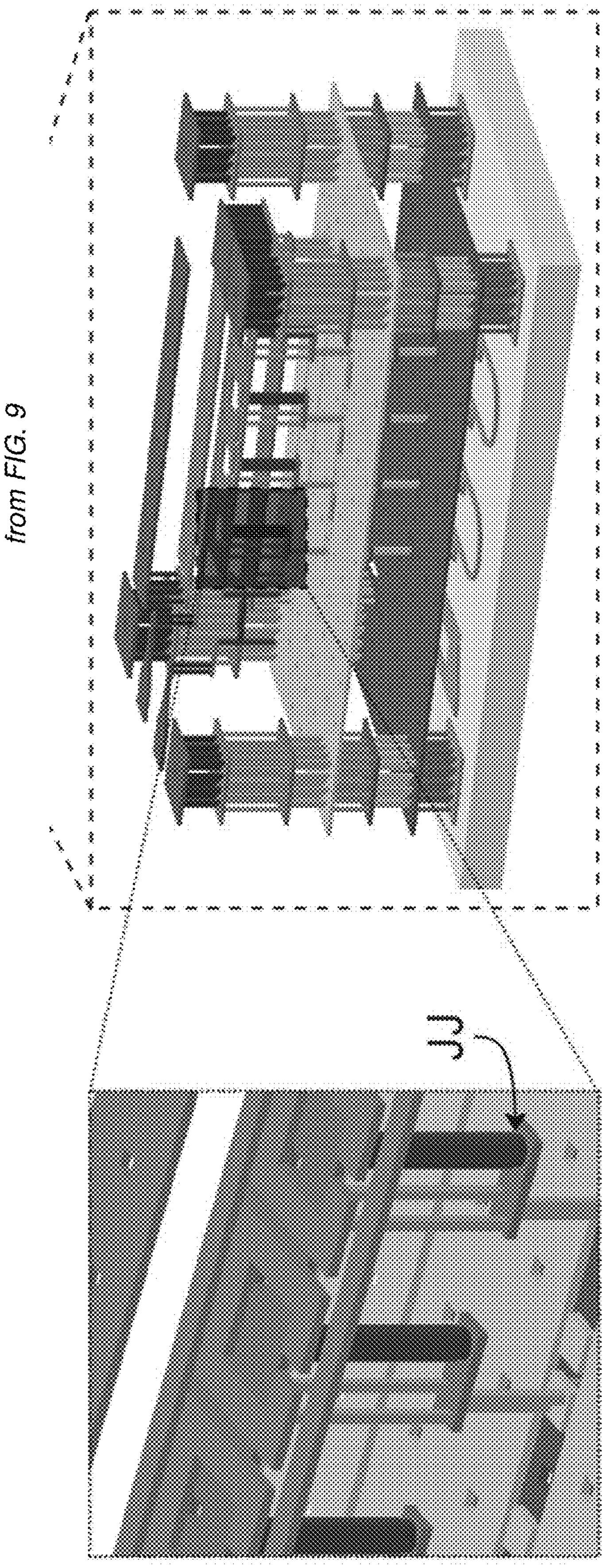
FIG. 10 is a 3D view of the 64-bit quantum memory device, showcasing the multi-layered structure of a single 1-bit storage cell and rf-SQUIDs, in accordance with various example embodiments and implementations of the subject disclosure.

The tunable nature of the resonators and the modularity of the design offer compatibility with future advancements in quantum technologies. The 4-bit array (or an even larger array) can be scaled in a straightforward manner. For example, the architecture of a 64-bit quantum memory device is illustrated in FIGS. 9 and 10. FIG. 9 shows the layout of the 64-bit quantum memory device, including 16 individual 4-bit storage cells arranged in a matrix. Each 4-bit storage cell comprises four quantum memory cells, with each quantum memory cell capable of storing a single quantum bit.

The layout indicates the separate read/write (R/W) and control (CTRL) lines for each quantum memory cell, (one is shown as a semi-transparent block) allowing for independent operation and addressing. The zoomed images of FIG. 10 (detailed inset) highlights a 3D view of a single 1-bit storage cell, showcasing the intricate multi-layered structure, to emphasize the use of four rf-SQUIDs per bit, which play a significant role in tuning the resonance frequency of the tunable interface resonators.

Figure 11:
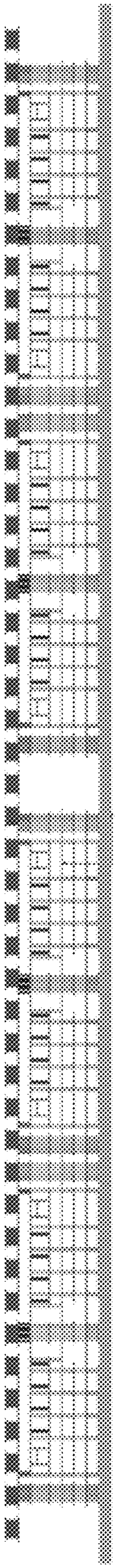
FIG. 11 is a 2D side view representation of an example 64-bit quantum memory stack, in accordance with various example embodiments and implementations of the subject disclosure.
Figure 12:
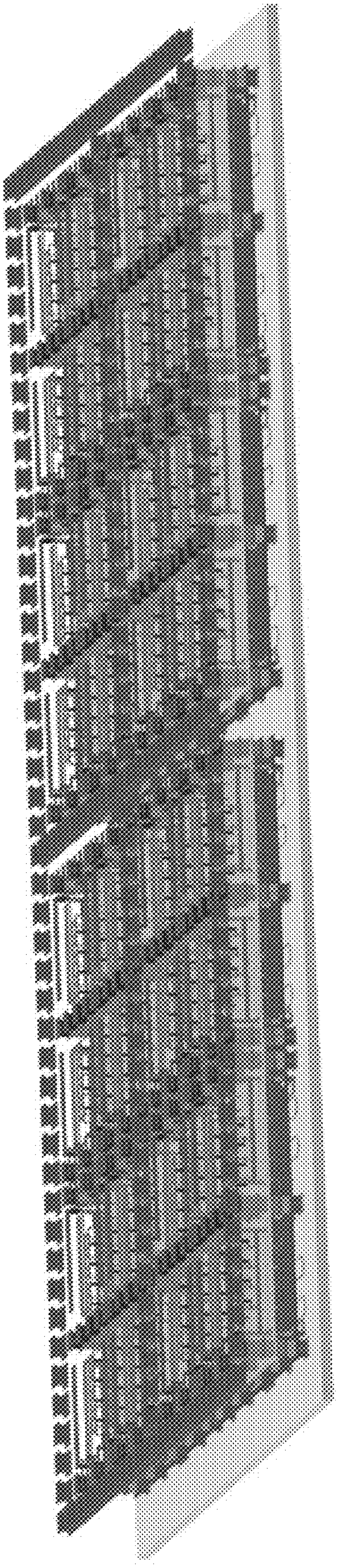
FIG. 12 is a 3D view representation of an example 64-bit quantum memory stack (with layer heights Z-scaled), in accordance with various example embodiments and implementations of the subject disclosure.
Figure 13:
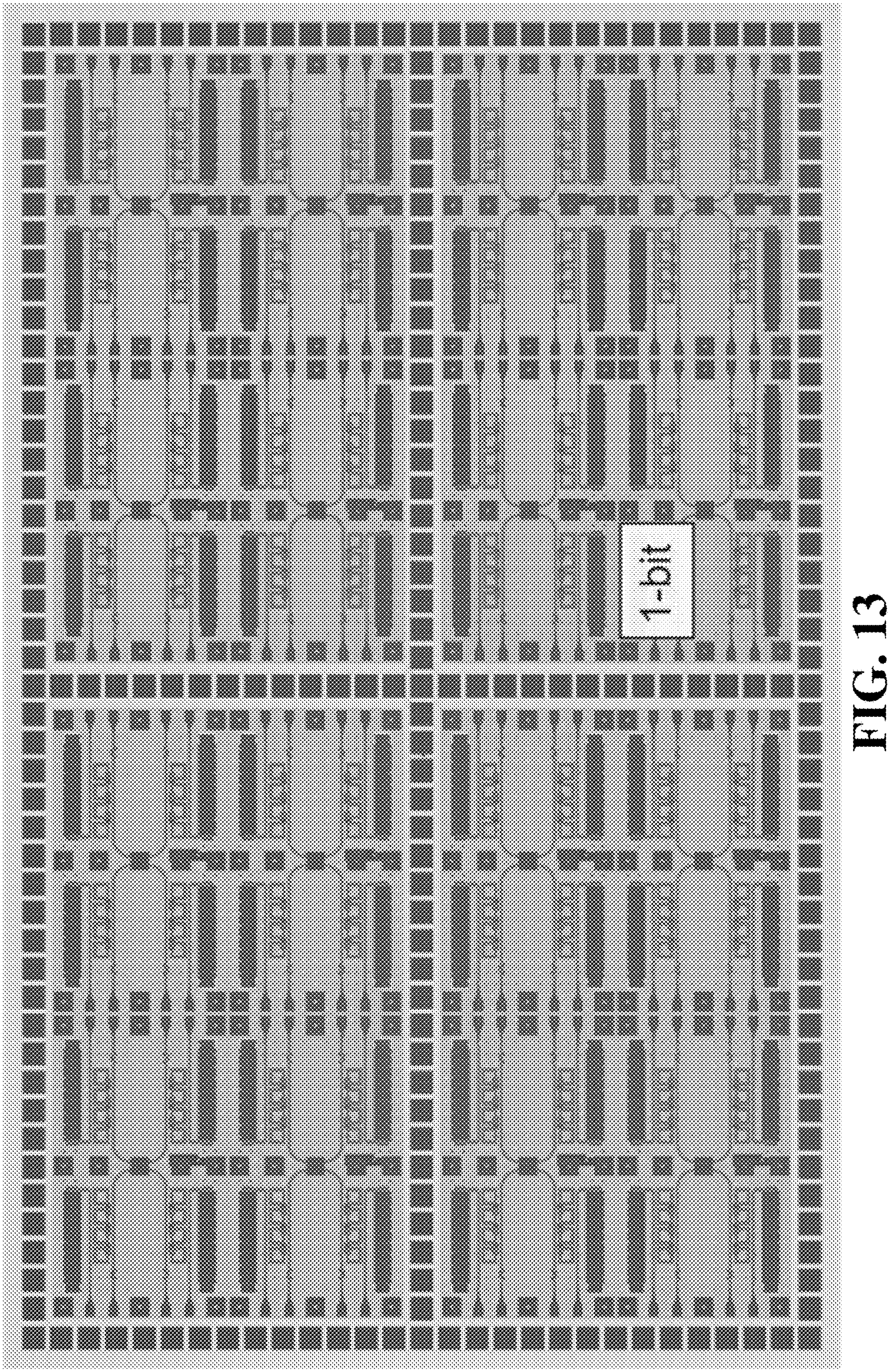
FIG. 13 is a top view representation showing an example 64-bit quantum memory device, in accordance with various example embodiments and implementations of the subject disclosure.
Figure 14:
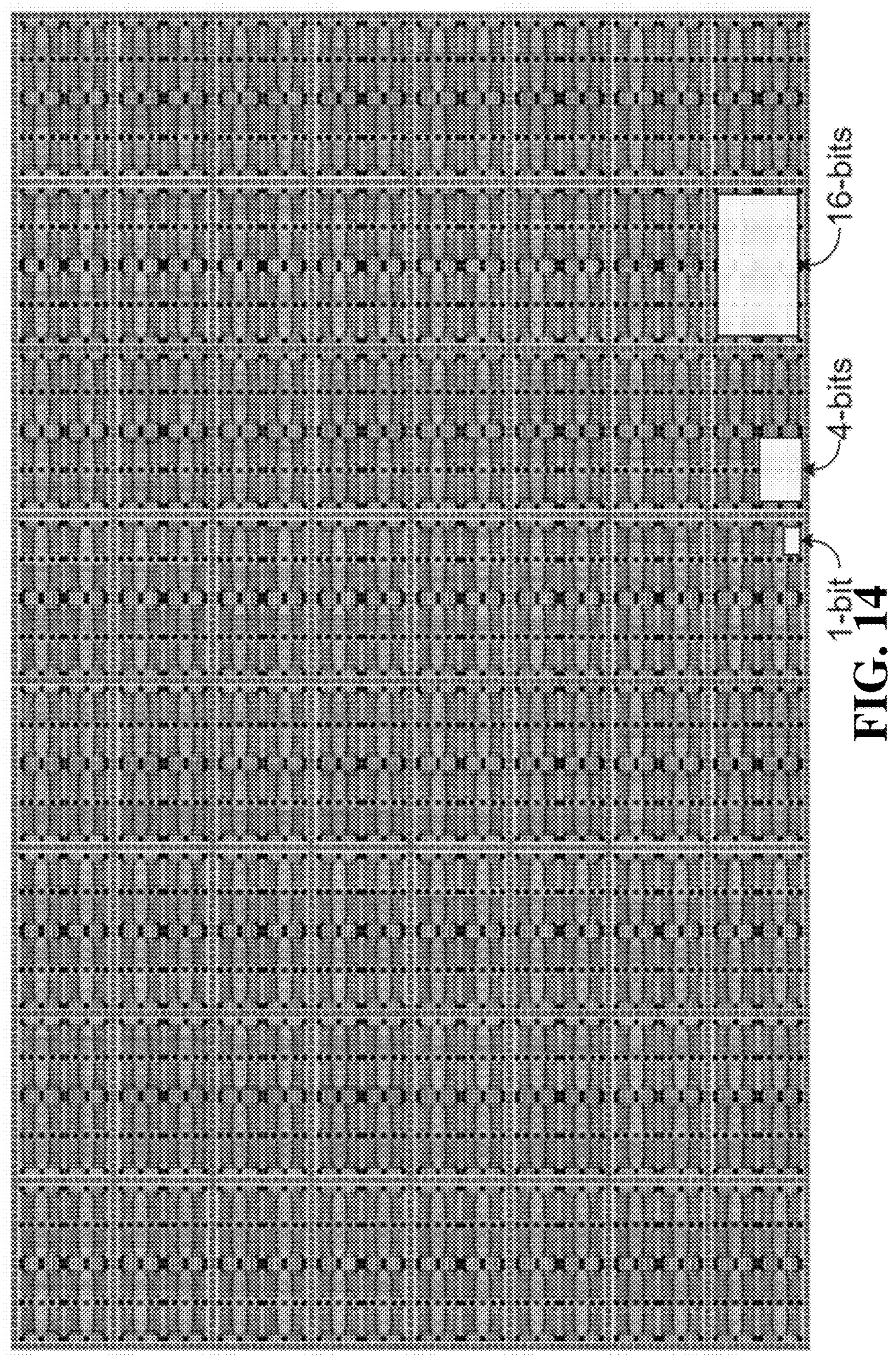
FIG. 14 is a top view representation showing an example one kilobyte (1 kb) quantum memory device, in accordance with various example embodiments and implementations of the subject disclosure.
Figure 15:
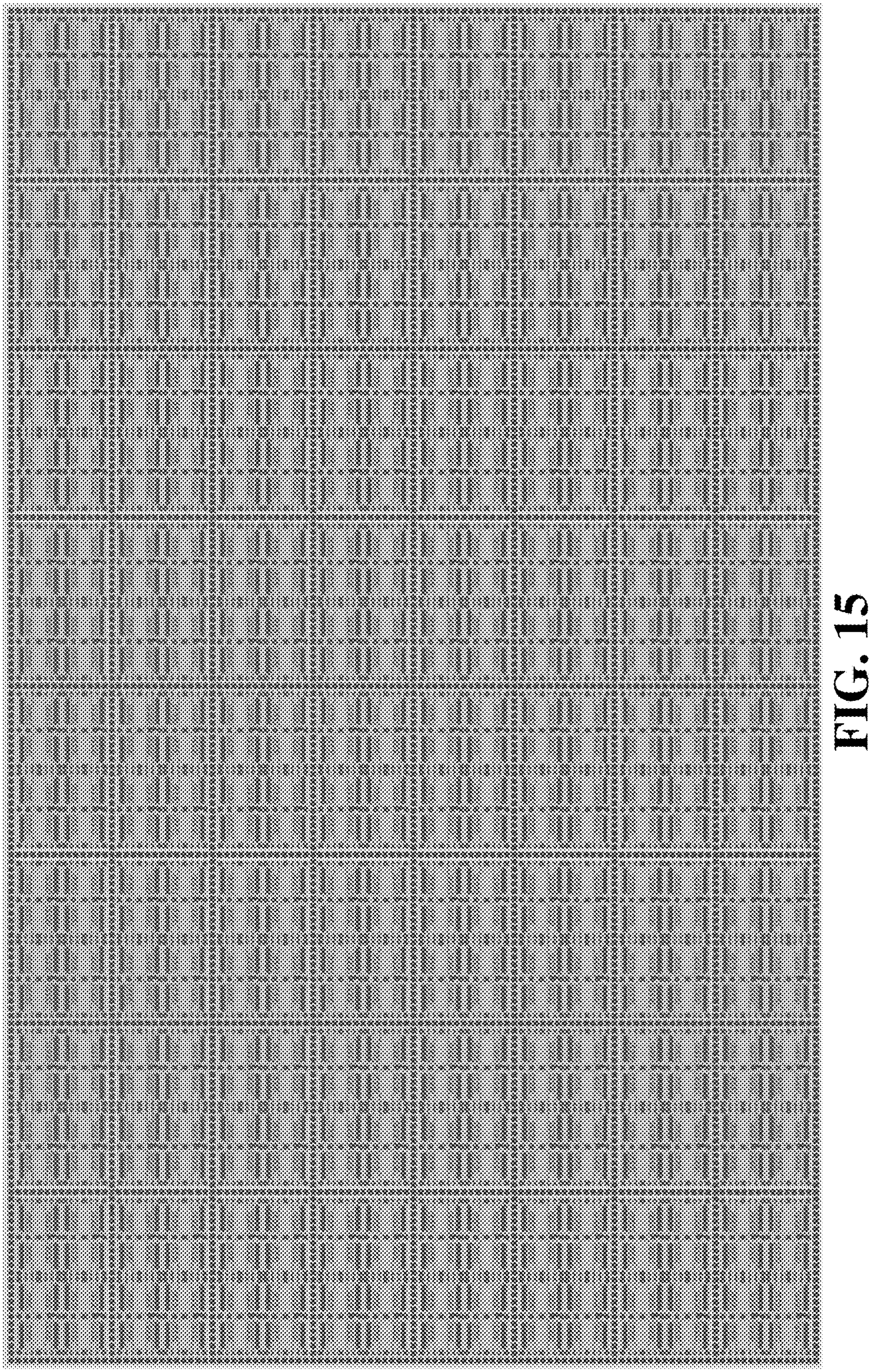
FIG. 15 is a bottom view representation of the example 1 kb quantum memory device of claim 14, in accordance with various example embodiments and implementations of the subject disclosure.

FIGS. 11 and 12 shows a side stack view and 3D view of the quantum memory stack, respectively, while FIG. 13 shows at top view of the example 64-bit quantum memory device. The side-stack view shows the vertical integration of the memory cells. The 3D view provides a comprehensive look at the full 64-bit stack, with the layer heights intentionally scaled in the Z-direction for better visibility. FIGS. 11 and 12 demonstrate the compact and efficient layout, making it suitable for integration and scaling to even larger size quantum memory device as shown in FIGS. 14 and 15. Indeed FIGS. 14 and 15 highlight one example layout and design implementation of a 1 kb quantum memory device.

Turning to additional details, in random access quantum memory (RAQM), classical addressing is accomplished through a control unit and the classical address decoding schemes. The control unit guides the microwave bus qubit to interact with different quantum memory cells to perform read and write operations. The accessing mechanism shares similarities to a classical RAM. Similar to classical memory, a quantum memory unit described herein supports the operation of reading from and writing to a quantum memory cell with a given address.

During the writing process, the microwave bus qubit is loaded with the quantum state that needs to be stored. With the classical address given, the quantum memory cell with this address interacts with the bus qubit and performs a SWAP gate to store the quantum state into the corresponding quantum memory cell. The writing process can be formally expressed as $$W(addr, |\phi\rangle)|0\rangle_{ind=addr} \otimes |\psi\rangle_{ind\neq addr} \rightarrow |\phi\rangle_{ind=addr} \otimes |\psi\rangle_{ind\neq addr})$$

where addr is the classical address information, and ind is the classical index of the quantum memory cells in the quantum memory cell array. The state of the quantum memory cell before the writing process is assumed to be in state $|0\rangle$ . During the reading process, a classical address is given. The quantum memory cell with the address qubit interacts with the bus qubit to perform a SWAP gate to swap the quantum state to the bus qubit. The reading process can be formally expressed as:

$$R(addr)\ |\phi\rangle_{ind=addr} \otimes |\psi\rangle_{ind\neq addr} \rightarrow |\phi\rangle_{(b)} \otimes (|0\rangle_{ind=addr} \otimes |\psi\rangle_{ind\neq addr})$$

where it is assumed that the quantum memory cell with the address addr is initially in the state $|\phi\rangle$ , and it is disentangled with the other qubits for simplicity. After the reading process, the bus qubit is in the state $|\phi\rangle$ .

Combining both reading and writing processes, operations can be expressed as $$F_{RAQM}(addr, |\phi\rangle^{(b)}, |\Psi\rangle^{(QM)} = \sum_j \alpha_j f_{QMC}(|\phi\rangle^{(b)}, |\lambda_j\rangle^{(QM)}_{\{ind=addr\}} \otimes |\psi_j\rangle^{(QM)},$$

$$= \sum_j \alpha_j |\lambda_j\rangle^{(b)} |\phi\rangle^{(QM)}_{\{ind=addr\}} \otimes |\psi_j\rangle^{(QM)},$$

where the operation on a single quantum memory cell can be shown as:

$$F_{RAQM}(|\psi\rangle^{(b)}, |\phi\rangle^{(QMC)}) = SWAP_{b,QMC}|\psi\rangle^{(b)} \otimes |\phi\rangle^{(QMC)} = |\phi\rangle^{(b)} \otimes |\psi\rangle^{(QM)}.$$

One or more implementations and embodiments can be embodied in system, such as described and represented in the example herein. The system can include a first quantum memory cell comprising a first quantum storage cavity and a first superconducting tunable resonator device. The first quantum storage cavity can include a first fixed resonator having a first resonance frequency based on a first length of the first fixed resonator. The first superconducting tunable resonator device can include a first superconducting transmission line coupled to first quantum information. In response to a first write operation signal, the first superconducting tunable resonator device is tuned to the first resonance frequency to transfer the first quantum information to the first quantum storage cavity. Following the transfer of the quantum information, the first superconducting tunable resonator device is detuned from the first resonance frequency to store the first quantum information in the first quantum storage cavity and prevent transfer of the first quantum information from the first quantum storage cavity back to the first superconducting resonator device. In response to a first read operation signal, the first superconducting tunable resonator device is retuned to the first resonance frequency to retransfer the first quantum information from the first quantum storage cavity back to the first superconducting transmission line of the first superconducting tunable resonator device. The system can include a second quantum memory cell including a second quantum storage cavity and a second superconducting tunable resonator device. The second quantum storage cavity can include a second fixed resonator having a second resonance frequency that is different from the first resonance frequency based on a second length of the second fixed resonator being different from the first length of the first fixed resonator. The second superconducting tunable resonator device can include a second superconducting transmission line coupled to second quantum information. In response to a second write operation signal, the second superconducting tunable resonator device is tuned to the second resonance frequency to transfer the second quantum information to the second quantum storage cavity. Following the transfer of the quantum information, the second superconducting tunable resonator device is detuned from the second resonance frequency to store the second quantum information in the second quantum storage cavity and prevent transfer of the second quantum information from the second quantum storage cavity back to the second superconducting resonator device. In response to a second read operation signal, the second superconducting tunable resonator device is retuned to the second resonance frequency to retransfer the second quantum information from the second quantum storage cavity back to the second superconducting transmission line of the second superconducting tunable resonator device.

The first quantum memory cell and the second quantum memory cell can be part of a larger memory device comprising a third quantum memory cell and a fourth quantum memory cell; the third quantum memory cell can include a third quantum storage cavity that resonates at a third resonance frequency that can be different from the first resonance frequency and the second resonance frequency based on a third length of the third fixed resonator being different from the first length of the first fixed resonator length and the second length of the second fixed resonator, and the fourth quantum memory cell can include a fourth quantum storage cavity that resonates at a fourth resonance frequency that can be different from the third resonance frequency based on a fourth length of the fourth fixed resonator being different from the third length of the third fixed resonator.

The first fixed resonator can include a first serpentine wire of the first length, and the second fixed resonator can include a second serpentine wire of the second length.

The first superconducting tunable resonator device can include a superconducting inductor and a capacitor coupled to the superconducting transmission line, one or more radio frequency-superconducting quantum interference devices (rf-SQUIDs) inductively coupled to the superconducting transmission line, and a tuning circuit comprising a control wire inductively coupled to the one or more rf-SQUIDs, wherein a first amount of controlled direct current carried by the control wire determines a first inductance of the one or more rf-SQUIDs to tune the superconducting tunable resonator device to the first resonance frequency, and wherein a second amount of controlled direct current carried by the control wire determines a second inductance of the one or more rf-SQUIDs to detune the first superconducting tunable resonator device from the first resonance frequency.

The one or more rf-SQUIDs can include an array of rf-SQUIDs aligned between the superconducting transmission line and the control wire.

The first quantum memory cell can include a first layered stack, with the first fixed resonator in a lower layer relative to the first superconducting tunable resonator device.

The first quantum storage cavity can include a quarter-wavelength resonator, and the first superconducting tunable resonator The first write operation signal, corresponding to the first superconducting tunable resonator device being tuned to the first resonance frequency, can be in parallel with or substantially in parallel with the second write operation signal, corresponding to the second superconducting tunable resonator device being tuned to the second resonance frequency.

The first superconducting tunable resonator device being tuned to the first resonance frequency can be based on a first direct current being applied to a first tuning device of the first superconducting tunable resonator device, and the second superconducting tunable resonator device being tuned to the second resonance frequency can be based on a second direct current being applied to a second tuning device of the second superconducting tunable resonator device.

The first read operation signal, corresponding to the first superconducting tunable resonator device being retuned to the first resonance frequency, can be in parallel with or substantially in parallel with the second read operation signal, corresponding to the second superconducting tunable resonator device being retuned to the second resonance frequency.

Figure 16:
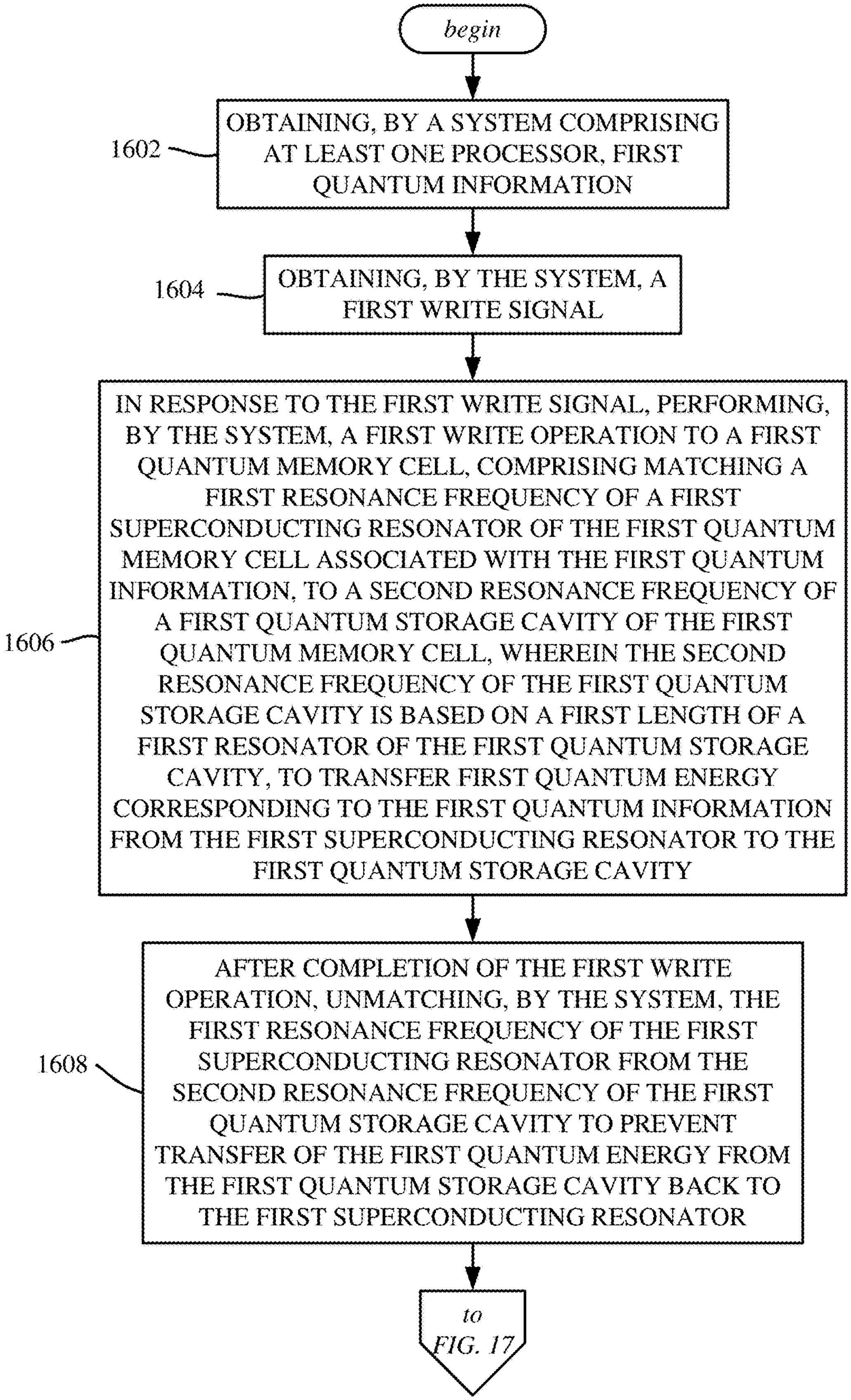
FIGS. 16 and 17 comprise a flow diagram showing example operations related to independently performing first and second write operations to first and second quantum memory cells, respectively, in which the first and second quantum memory cells have different length fixed resonators of their quantum storage cavities, in accordance with various example embodiments and implementations of the subject disclosure.
Figure 17:
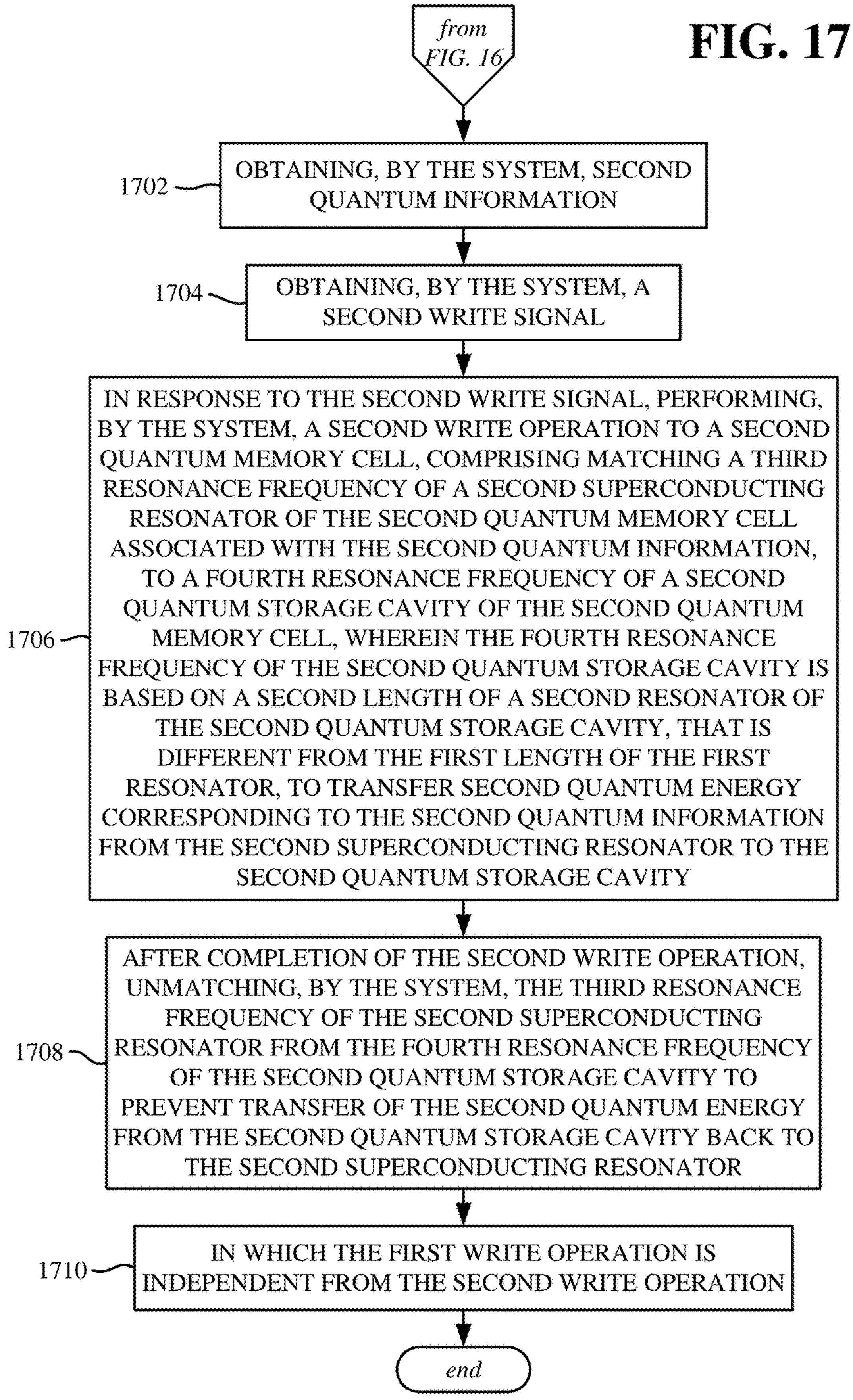

One or more example implementations and embodiments, such as corresponding to example operations of a method, can be represented in FIGS. 16 and 17. Example operation 1602 of FIG. 16 represents obtaining, by a system comprising at least one processor, first quantum information. Example operation 1604 represents obtaining, by the system, a first write signal. Example operation 1606 represents, in response to the first write signal, performing, by the system, a first write operation to a first quantum memory cell, comprising matching a first resonance frequency of a first superconducting resonator of the first quantum memory cell associated with the first quantum information, to a second resonance frequency of a first quantum storage cavity of the first quantum memory cell, wherein the second resonance frequency of the first quantum storage cavity can be based on a first length of a first resonator of the first quantum storage cavity, to transfer first quantum energy corresponding to the first quantum information from the first superconducting resonator to the first quantum storage cavity. Example operation 1606 represents, after completion of the first write operation, unmatching, by the system, the first resonance frequency of the first superconducting resonator from the second resonance frequency of the first quantum storage cavity to prevent transfer of the first quantum energy from the first quantum storage cavity back to the first superconducting resonator. The process continues to FIG. 17, where example operation 1702 of FIG. 17 represents obtaining, by the system, second quantum information. Example operation 1704 represents obtaining, by the system, a second write signal. Example operation 1706 represents, in response to the second write signal, performing, by the system, a second write operation to a second quantum memory cell, comprising matching a third resonance frequency of a second superconducting resonator of the second quantum memory cell associated with the second quantum information, to a fourth resonance frequency of a second quantum storage cavity of the second quantum memory cell, wherein the fourth resonance frequency of the second quantum storage cavity can be based on a second length of a second resonator of the second quantum storage cavity, that can be different from the first length of the first resonator, to transfer second quantum energy corresponding to the second quantum information from the second superconducting resonator to the second quantum storage cavity. Example operation 1708 represents, after completion of the second write operation, unmatching, by the system, the third resonance frequency of the second superconducting resonator from the fourth resonance frequency of the second quantum storage cavity to prevent transfer of the second quantum energy from the second quantum storage cavity back to the second superconducting resonator. Example operation 1710 represents that the first write operation can be independent from the second write operation.

Performing the first write operation can be in parallel with or substantially in parallel with performing the second write operation.

Further operations can include obtaining, by the system, a first read signal, in response to the first read signal, performing, by the system, a first read operation from the first quantum memory cell, which can include matching the first resonance frequency of the first superconducting resonator of the first quantum memory cell to the second resonance frequency of the first quantum storage cavity of the first quantum memory cell, to transfer the first quantum energy corresponding to the first quantum information back from the first quantum storage cavity to the first superconducting resonator for output by the system, obtaining, by the system, a second read signal, and in response to the second read signal, performing, by the system, a second read operation from the second quantum memory cell, which can include matching the third resonance frequency of the second superconducting resonator of the second quantum memory cell to the fourth resonance frequency of the second quantum storage cavity of the second quantum memory cell, to transfer the second quantum energy corresponding to the second quantum information back from the second quantum storage cavity to the second superconducting resonator for output by the system; the first read operation can be independent from the second read operation.

Performing the first read operation can be in parallel with or substantially in parallel with performing the second read operation.

The first superconducting resonator can be tunable, the first quantum storage cavity can have a tunable resonance frequency, and matching the first resonance frequency to the second resonance frequency can include tuning the first superconducting resonator to the second resonance frequency and tuning the tunable resonance frequency of the first quantum storage cavity to the second resonance frequency.

Tuning the first superconducting resonator to the second resonance frequency can include outputting a first direct current to a first control wire inductively coupled to the first superconducting resonator, and the tuning the tunable resonance frequency of the first quantum storage cavity can include outputting a second direct current to a second control wire inductively coupled to the first quantum storage cavity.

One or more implementations and embodiments can be embodied in a quantum memory device. The quantum memory device can include a group of respective quantum memory cells. The respective quantum memory cells can include respective quantum storage cavities coupled to respective superconducting tunable resonator devices. At respective write times, the respective superconducting tunable resonator devices can be tuned to respective resonant frequencies of the respective quantum storage cavities to transfer respective quantum bits associated with the respective superconducting tunable resonator devices to the respective quantum storage cavities. The respective resonant frequencies can be different from one another based on respective different lengths of respective resonators of the respective quantum storage cavities. At respective storage times, the respective superconducting tunable resonator devices can be detuned from the respective resonant frequencies of the respective quantum storage cavities to store the respective quantum bits in the respective quantum storage cavities and prevent transfer of the respective quantum bits from the respective quantum storage cavities back to the respective superconducting tunable resonator devices. At respective read times, the respective superconducting tunable resonator devices can be retuned to the respective resonant frequencies of the respective quantum storage cavities to retransfer the respective quantum bits from the respective quantum storage cavities back to the respective superconducting tunable resonator devices.

The respective superconducting tunable resonator devices can include respective tuning devices that can include respective sets of one or more radio frequency-superconducting quantum interference devices (rf-SQUIDs) inductively coupled to respective superconducting transmission lines associated with the respective quantum bits, and respective control wires inductively coupled to the respective sets of the one or more rf-SQUIDS. Respective direct current levels applied to the respective control wires flow through the respective control wires as respective control currents that determine respective inductances of the respective sets of the one or more rf-SQUIDs to tune the respective superconducting tunable resonator devices with respect to the respective resonant frequencies of the respective quantum storage cavities.

The quantum memory device further can include shielding poles configured to magnetically shield at least some of the respective quantum memory cells from one another.

The respective write times can be scheduled, by a computing device, to facilitate parallel or substantially parallel transfer of the respective quantum bits to the respective quantum storage cavities.

As can be seen, the technology described herein facilitates integrating multiple quantum memory cells into a quantum memory device, including with independent classical addressing, in which each quantum memory cell is independently addressable using classical controls. This capability allows for parallel operations and efficient management of different quantum memory cells within the array. The quantum state stored in one quantum memory cell remains isolated from those in other quantum memory cells, which ensures that quantum information in each cell remains decoupled, minimizing cross-talk and maintaining data integrity. Efficient read and write operations are facilitated, in which the time required for performing read and write operations on a quantum memory device is relatively small, which enhances overall efficiency. Parallel addressing capability provides the ability to address multiple quantum memory cells simultaneously, which significantly increases the bandwidth of read and write operations, improving the quantum memory device's efficiency.

Such classical random-access functionality in random access quantum memory is significant with respect to storing and retrieving quantum states across various quantum memory cells at different times. The quantum memory device can integrate a large number of quantum memory cells while minimizing cross-talk errors, ensuring the quantum information for a given usage scenario can be reliably stored and accessed.

The quantum memory device can be integrated with circuit quantum electrodynamics superconducting processors or other qubit platforms, provided efficient transduction mechanisms are available. This development is particularly timely, as the design of quantum computing systems is shifting towards a separation of computing and memory functions. In such an architecture, future quantum computing devices will include two primary units, namely a quantum processing unit for computation, and a quantum memory unit for information storage. The quantum processing unit, with a small number of computing registers, can be optimized for fast and reliable universal gate operations. In contrast, the quantum memory unit, designed for long-term storage, contains a large number of quantum registers that may not support universal gate sets, but are optimized for preserving quantum information over extended periods. By separating the functions of computing and storage, the quantum processing unit and quantum memory unit can be realized using different physical techniques, each optimized for its specific function, e.g., the quantum processing unit can leverage fast gate operations, while the quantum memory unit focuses on maintaining long coherence times. Like classical memory, a quantum memory unit needs to support reading from and writing to a specific quantum memory cell at a given address, allowing for efficient data management and retrieval. The quantum memory device array design described herein facilitates the implementation of random access quantum memory, enabling the storage of quantum information between computational gate operations and providing a robust solution for the evolving needs of quantum computing architectures.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms "component," "system," "platform," "layer," "selector," "interface," and the like are intended to refer to a computer-related resource or an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A system, comprising:

a first quantum memory cell comprising a first quantum storage cavity and a first superconducting tunable resonator device, the first quantum storage cavity comprising a first fixed resonator having a first resonance frequency based on a first length of the first fixed resonator, and the first superconducting tunable resonator device comprising a first superconducting transmission line coupled to first quantum information, wherein, in response to a first write operation signal, the first superconducting tunable resonator device is tuned to the first resonance frequency to transfer the first quantum information to the first quantum storage cavity;

wherein, following the transfer of the quantum information, the first superconducting tunable resonator device is detuned from the first resonance frequency to store the first quantum information in the first quantum storage cavity and prevent transfer of the first quantum information from the first quantum storage cavity back to the first superconducting resonator device; and wherein, in response to a first read operation signal, the first superconducting tunable resonator device is retuned to the first resonance frequency to retransfer the first quantum information from the first quantum storage cavity back to the first superconducting transmission line of the first superconducting tunable resonator device; and a second quantum memory cell comprising a second quantum storage cavity and a second superconducting tunable resonator device, the second quantum storage cavity comprising a second fixed resonator having a second resonance frequency that is different from the first resonance frequency based on a second length of the second fixed resonator being different from the first length of the first fixed resonator, and the second superconducting tunable resonator device comprising a second superconducting transmission line coupled to second quantum information, wherein, in response to a second write operation signal, the second superconducting tunable resonator device is tuned to the second resonance frequency to transfer the second quantum information to the second quantum storage cavity, wherein, following the transfer of the quantum information, the second superconducting tunable resonator device is detuned from the second resonance frequency to store the second quantum information in the second quantum storage cavity and prevent transfer of the second quantum information from the second quantum storage cavity back to the second superconducting resonator device, and wherein, in response to a second read operation signal, the second superconducting tunable resonator device is retuned to the second resonance frequency to retransfer the second quantum information from the second quantum storage cavity back to the second superconducting transmission line of the second superconducting tunable resonator device.

2. The system of claim 1, wherein the first quantum memory cell and the second quantum memory cell are part of a larger memory device comprising a third quantum memory cell and a fourth quantum memory cell, wherein the third quantum memory cell comprises a third quantum storage cavity that resonates at a third resonance frequency that is different from the first resonance frequency and the second resonance frequency based on a third length of the third fixed resonator being different from the first length of the first fixed resonator length and the second length of the second fixed resonator, and wherein the fourth quantum memory cell comprises a fourth quantum storage cavity that resonates at a fourth resonance frequency that is different from the third resonance frequency based on a fourth length of the fourth fixed resonator being different from the third length of the third fixed resonator.

3. The system of claim 1, wherein the first fixed resonator comprises a first serpentine wire of the first length, and the second fixed resonator comprises a second serpentine wire of the second length.

4. The system of claim 1, wherein the first superconducting tunable resonator device comprises a superconducting inductor and a capacitor coupled to the superconducting transmission line, one or more radio frequency-superconducting quantum interference devices (rf-SQUIDs) inductively coupled to the superconducting transmission line, and a tuning circuit comprising a control wire inductively coupled to the one or more rf-SQUIDs, wherein a first amount of controlled direct current carried by the control wire determines a first inductance of the one or more rf-SQUIDs to tune the superconducting tunable resonator device to the first resonance frequency, and wherein a second amount of controlled direct current carried by the control wire determines a second inductance of the one or more rf-SQUIDs to detune the first superconducting tunable resonator device from the first resonance frequency.

5. The system of claim 4, wherein the one or more rf-SQUIDs comprise an array of rf-SQUIDs aligned between the superconducting transmission line and the control wire.

6. The system of claim 5, wherein the first quantum memory cell comprises a first layered stack, with the first fixed resonator in a lower layer relative to the first superconducting tunable resonator device.

7. The system of claim 1, wherein the first quantum storage cavity comprises a quarter-wavelength resonator, and wherein the first superconducting tunable resonator device comprises a half-wavelength resonator.

8. The system of claim 1, wherein the first write operation signal, corresponding to the first superconducting tunable resonator device being tuned to the first resonance frequency, is in parallel with or substantially in parallel with the second write operation signal, corresponding to the second superconducting tunable resonator device being tuned to the second resonance frequency.

9. The system of claim 8, wherein the first superconducting tunable resonator device being tuned to the first resonance frequency is based on a first direct current being applied to a first tuning device of the first superconducting tunable resonator device, and wherein the second superconducting tunable resonator device being tuned to the second resonance frequency is based on a second direct current being applied to a second tuning device of the second superconducting tunable resonator device.

10. The system of claim 1, wherein the first read operation signal, corresponding to the first superconducting tunable resonator device being retuned to the first resonance frequency, is in parallel with or substantially in parallel with the second read operation signal, corresponding to the second superconducting tunable resonator device being retuned to the second resonance frequency.

11. A method, comprising:

obtaining, by a system comprising at least one processor, first quantum information;

obtaining, by the system, a first write signal;

in response to the first write signal, performing, by the system, a first write operation to a first quantum memory cell, comprising matching a first resonance frequency of a first superconducting resonator of the first quantum memory cell associated with the first quantum information, to a second resonance frequency of a first quantum storage cavity of the first quantum memory cell, wherein the second resonance frequency of the first quantum storage cavity is based on a first length of a first resonator of the first quantum storage cavity, to transfer first quantum energy corresponding to the first quantum information from the first superconducting resonator to the first quantum storage cavity; and after completion of the first write operation, unmatching, by the system, the first resonance frequency of the first superconducting resonator from the second resonance frequency of the first quantum storage cavity to prevent transfer of the first quantum energy from the first quantum storage cavity back to the first superconducting resonator;

obtaining, by the system, second quantum information;

obtaining, by the system, a second write signal;

in response to the second write signal, performing, by the system, a second write operation to a second quantum memory cell, comprising matching a third resonance frequency of a second superconducting resonator of the second quantum memory cell associated with the second quantum information, to a fourth resonance frequency of a second quantum storage cavity of the second quantum memory cell, wherein the fourth resonance frequency of the second quantum storage cavity is based on a second length of a second resonator of the second quantum storage cavity, that is different from the first length of the first resonator, to transfer second quantum energy corresponding to the second quantum information from the second superconducting resonator to the second quantum storage cavity; and after completion of the second write operation, unmatching, by the system, the third resonance frequency of the second superconducting resonator from the fourth resonance frequency of the second quantum storage cavity to prevent transfer of the second quantum energy from the second quantum storage cavity back to the second superconducting resonator, wherein the first write operation is independent from the second write operation.

12. The method of claim 11, wherein the performing of the first write operation is in parallel with or substantially in parallel with the performing of the second write operation.

13. The method of claim 11, further comprising:

obtaining, by the system, a first read signal;

in response to the first read signal, performing, by the system, a first read operation from the first quantum memory cell, comprising matching the first resonance frequency of the first superconducting resonator of the first quantum memory cell to the second resonance frequency of the first quantum storage cavity of the first quantum memory cell, to transfer the first quantum energy corresponding to the first quantum information back from the first quantum storage cavity to the first superconducting resonator for output by the system;

obtaining, by the system, a second read signal; and in response to the second read signal, performing, by the system, a second read operation from the second quantum memory cell, comprising matching the third resonance frequency of the second superconducting resonator of the second quantum memory cell to the fourth resonance frequency of the second quantum storage cavity of the second quantum memory cell, to transfer the second quantum energy corresponding to the second quantum information back from the second quantum storage cavity to the second superconducting resonator for output by the system, wherein the first read operation is independent from the second read operation.

14. The method of claim 13, wherein the performing of the first read operation is in parallel with or substantially in parallel with the performing of the second read operation.

15. The method of claim 11, wherein the first superconducting resonator is tunable, wherein the first quantum storage cavity has a tunable resonance frequency, and wherein the matching of the first resonance frequency to the second resonance frequency comprises tuning the first superconducting resonator to the second resonance frequency and tuning the tunable resonance frequency of the first quantum storage cavity to the second resonance frequency.

16. The method of claim 15, wherein the tuning of the first superconducting resonator to the second resonance frequency comprises outputting a first direct current to a first control wire inductively coupled to the first superconducting resonator, and wherein the tuning of the tunable resonance frequency of the first quantum storage cavity comprises outputting a second direct current to a second control wire inductively coupled to the first quantum storage cavity.

17. A quantum memory device, comprising:

a group of respective quantum memory cells, the respective quantum memory cells comprising respective quantum storage cavities coupled to respective superconducting tunable resonator devices, wherein, at respective write times, the respective superconducting tunable resonator devices are tuned to respective resonant frequencies of the respective quantum storage cavities to transfer respective quantum bits associated with the respective superconducting tunable resonator devices to the respective quantum storage cavities, wherein the respective resonant frequencies are different from one another based on respective different lengths of respective resonators of the respective quantum storage cavities, wherein, at respective storage times, the respective superconducting tunable resonator devices are detuned from the respective resonant frequencies of the respective quantum storage cavities to store the respective quantum bits in the respective quantum storage cavities and prevent transfer of the respective quantum bits from the respective quantum storage cavities back to the respective superconducting tunable resonator devices, and wherein, at respective read times, the respective superconducting tunable resonator devices are retuned to the respective resonant frequencies of the respective quantum storage cavities to retransfer the respective quantum bits from the respective quantum storage cavities back to the respective superconducting tunable resonator devices.

18. The quantum memory device of claim 17, wherein the respective superconducting tunable resonator devices comprise respective tuning devices comprising respective sets of one or more radio frequency-superconducting quantum interference devices (rf-SQUIDs) inductively coupled to respective superconducting transmission lines associated with the respective quantum bits, and respective control wires inductively coupled to the respective sets of the one or more rf-SQUIDS, wherein respective direct current levels applied to the respective control wires flow through the respective control wires as respective control currents that determine respective inductances of the respective sets of the one or more rf-SQUIDs to tune the respective superconducting tunable resonator devices with respect to the respective resonant frequencies of the respective quantum storage cavities.

19. The quantum memory device of claim 17, further comprising shielding poles configured to magnetically shield at least some of the respective quantum memory cells from one another.

20. The quantum memory device of claim 17, wherein the respective write times are scheduled, by a computing device, to facilitate parallel or substantially parallel transfer of the respective quantum bits to the respective quantum storage cavities.

* * * * *